United States Patent [19]

Uhm et al.

[11] Patent Number: 5,142,250
[45] Date of Patent: Aug. 25, 1992

[54] HIGH POWER MICROWAVE GENERATOR

[75] Inventors: Han S. Uhm, Potomac; Khanh T. Nguyen, Silver Spring, both of Md.

[73] Assignee: The United States of America as represented by the Secretary of the Navy, Washington, D.C.

[21] Appl. No.: 819,699

[22] Filed: Jan. 14, 1992

[51] Int. Cl.⁵ .............................................. H03B 9/00
[52] U.S. Cl. .................................... 331/83; 315/5.39
[58] Field of Search .................... 331/83; 315/5.39, 39, 315/39.51; 333/227

[56] References Cited

U.S. PATENT DOCUMENTS

| | | | |
|---|---|---|---|
| 2,813,996 | 11/1957 | Chodorow | 315/39 |
| 3,292,101 | 12/1966 | Favalier | 331/83 |
| 3,622,834 | 11/1971 | Lien | 315/5.39 |
| 4,049,995 | 9/1977 | Edgecombe | 315/5.39 |
| 4,100,457 | 7/1978 | Edgecombe | 315/5.39 |
| 4,209,755 | 6/1980 | Busacca et al. | 331/83 |
| 4,300,105 | 11/1981 | Busacca et al. | 331/83 |
| 5,023,563 | 6/1991 | Harvey et al. | 315/5.43 |
| 5,051,659 | 9/1991 | Uhm | 315/111.41 |

*Primary Examiner*—Robert J. Pascal
*Attorney, Agent, or Firm*—Kenneth E. Walden; Jacob Shuster

[57] ABSTRACT

Conversion of electron beam energy into high power microwave energy is effected within the cavity of a Klystron device to which the electron beam is accelerated from a continuous supply source through an ion focussing channel. Ion focussing is achieved by establishment of a preionized background plasma within the channel to modulate the current of the electron beam in response to wake field effects and cause bunching of the electron beam during propagation to the Klystron device.

8 Claims, 1 Drawing Sheet

HIGH POWER MICROWAVE GENERATOR

BACKGROUND OF THE INVENTION

This invention relates generally to the generation of microwave energy, and more particularly to high power generation by charge bunching of an intense, current-modulated electron beam.

Charge bunching of a continuous electron beam is a technique already well known in the art, as disclosed for example in U.S. Pat. No. 2,813,996 to Chodorow. Such bunching technique, exploiting the high self-electric field property of an intense relativistic electron beam propagated through a buncher cavity of a Klystron amplifier device, has been utilized for generation of microwave energy with much success. A Klystron device is disclosed for example in U.S. Pat. No. 4,049,995.

In a conventional Klystron amplifier, an electron beam is modulated by an electromagnetic field induced within a buncher cavity. For effective high power microwave generation, the Klystron amplifier is driven by an external microwave source while an intense relativistic electron beam is propagated through a drift tube into the buncher cavity thereby exploiting the high self-electric field property of such beam to enhance bunching and prevent RF breakdown under high voltage gaps. Because of the self-electric field, a space-charge threshold is imposed on current modification of a high current electron beam to somewhat limit operation of the Klystron amplifier as a high power microwave generator. It is therefore an important object of the present invention to increase the effectiveness of a Klystron device as a high power microwave generator by avoiding the space-charge current limitation and eliminating use of an external high power microwave source.

SUMMARY OF THE INVENTION

In accordance with the present invention an intense relativistic electron beam is continuously accelerated into an ion focussing plasma chamber within which a preionized background plasma is generated and maintained to produce wake field waves during propagation of the electron beam. The wake field wave effects are such as to modulate the current of the electron beam as a result of associated axial electric field components. Bunching of the electron beam when so modulated is accommodated by the channel path distance through the plasma chamber to the entrance of the cavity within a Klystron device. The wake field effects producing high amplitude modulation of the electron beam current and electron accumulation associated with beam bunching are found to be effective to cause conversion of the beam electron energy into microwave energy within the cavity of the Klystron device without the space-charge limiting threshold heretofore imposed on current modulation and without use of an external high-power microwave drive.

BRIEF DESCRIPTION OF THE DRAWING FIGURES

Other objects, advantages and novel features of the invention will become apparent from the following detailed description of the invention when considered in conjunction with the accompanying drawing wherein:

FIG. 1 is a partially schematic block diagram and side section view of apparatus forming the high power microwave energy generating system of the present invention; and FIG. 2 is a graph showing electron beam current characteristics associated with the system illustrated in FIG. 1.

DETAILED DESCRIPTION OF PREFERRED EMBODIMENT

Figure 1:
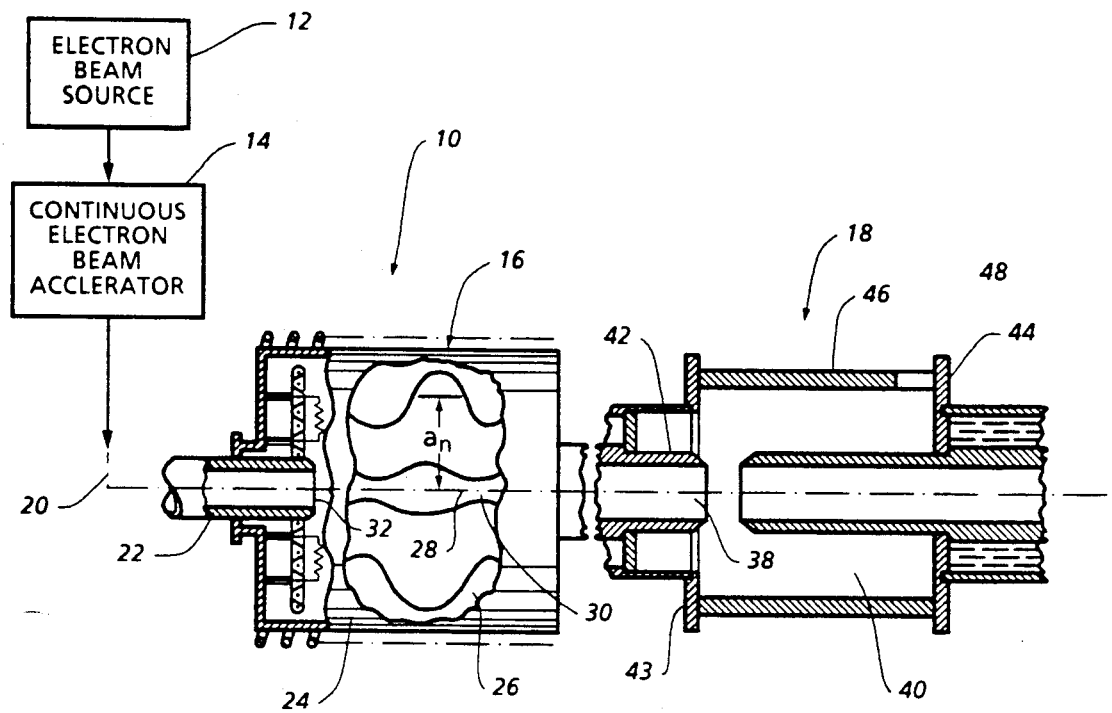

Referring now to the drawing in detail, FIG. 1 illustrates a high power microwave generating system, generally referred to by reference numeral 10, which includes an electron beam source 12 and a beam accelerator 14. The source 12 and accelerator components are generally well known in the art for producing an intense and continuous relativistic electron beam. Such beam as denoted by reference numeral 20 in FIG. 1 is fed to an ion focussing channel component 16 in accordance with the present invention. The electron beam is current modulated and bunched by the channel component 16 to produce an output beam fed to a Klystron type of cavity device, generally referred to by reference numeral 18. The electron energy of the beam is converted into microwave energy within the Klystron device in a manner generally known in the art, but without the problems and limitations usually associated therewith because of the prior processing of the beam in channel component 16 as will be explained hereinafter.

As diagrammatically shown in FIG. 1, the continuous electron beam 20 from accelerator 14 is fed through a drift tube 22 into a plasma chamber housing 24 of the ion focussing channel component 16. A tenuous background plasma 26 is established within the chamber of housing 24 by a suitable plasma generating system such as that disclosed in U. S. Pat. No. 5,051,659 to Uhm et al. A preionized plasma channel thereby forms a path along axis 28 within the chamber for the electron beam 30. Electrostatic force generated by the head of the electron beam creates a trailing ion channel along the axis 28 to partially neutralize the space charge field of the beam for ion focussing thereof. Plasma electrons of the diffuse plasma 26 surrounding the electron beam 30 are thereby displaced radially to a charge neutralization radius ($a_n$) where the beam charge is the same as the total ion charge of the channel electrons displaced by the space charge field during the ion focussed beam propagation regime. The plasma electrons radially overshoot the charge neutralization radius ($a_n$) as diagrammed in FIG. 1 causing bunching of the electron beam 30 characterized by oscillation of the plasma electrons producing wake field wave effects as evaluated for example by applicant in an article entitled "Wakefield Theory of a Relativistic Electron Beam", published Oct. 15, 1990 by Elsevier Science Publishers in Physics Letters A, Volume 149, number 9. The wake field effect is electrostatic in nature having directionally axial and radial components of an associated electric field. The axial component of such electric field modulates the electron energy of the beam as it is propagated along axis 28 as well as the beam current while the radial component of the electric field causes the aforementioned radial displacement of the beam surrounding plasma 26 as diagrammed in FIG. 1.

Modulation of the electron beam 30 during propagation through the channel component 16 originates from energy exchange between beam segments. Evaluation of such modulation based on a theoretical model assumes that the axial component of the electric field of the wakefield waves has a sinusoidal form of frequency ($\omega$). Labeling the time $t_0$ at which a beam segment exits the accelerator 14 and enters the plasma chamber ($z=0$ at $t=t_0$), the axial momentum change $\Delta p(z,t_0)$ on such beam segment is expressed as:

$$\Delta p(z,t_0) = -\frac{eE_0 z}{\beta c} \sin\theta. \quad (1)$$

where $\beta c$ is the instantaneous axial velocity of the beam segment at time $t_0$, $\theta = \omega t_0$, and the maximum strength $E_0$ of the wakefield wave is:

$$E_0 = \frac{mc}{e} \omega_{pe} \frac{\sqrt{(2\epsilon - \epsilon^2)}}{1 - \epsilon} G. \quad (2)$$

In the foregoing equation (2), c is the speed of light in a vacuum, $\epsilon$ is a beam parameter related to beam intensity, G is a geometrical factor, $\epsilon_{pe}$ is the electron plasma frequency, while e and m are charge and rest-mass of electrons, respectively. Equation (1) is equivalently expressed as:

$$\frac{d\gamma}{dz} = -\frac{eE_0}{mc^2} \sin\theta. \quad (3)$$

where $\gamma$ is the relativistic mass factor. Integrating Eq. (3) with respect to z and making use of the initial condition $\gamma = \gamma_b$ at $z=0$, the relativistic mass factor $\gamma$ for the beam segment at time $t_0$ is:

$$\gamma = \gamma_b - \frac{eE_0 z}{mc^2} \sin\theta \quad (4)$$

Making use of the axial velocity $dz/dt = \beta c = (\gamma^2 - 1)^{\frac{1}{2}} c/\gamma$ the initial condition $\gamma = \gamma_b$ at $t=t_0$, Eq. (3) may be integrated with respect to time to obtain $$\sqrt{\gamma_b^2 - 1} - \sqrt{\gamma^2 - 1} = \frac{eE_0 \sin\theta}{mc\omega}(\phi - \theta). \quad (5)$$

where $\phi = \omega t$. Differentiating $\phi$ in Eq. (5) with respect to $\theta$, and making use of Eq. (4) the derivative $d\phi/d\theta$ is expressed as:

$$\left(\frac{d\phi}{d\theta} - 1\right)\tan\theta = \phi - \frac{\omega}{\beta c} z. \quad (6)$$

Eliminating $\phi$ in Eq. (6) by use of Eq. (5), the derivative $d\phi/d\theta$ is uniquely determined in terms of the propagation distance z and the injection time $\theta$. Within the limits of a relativistic electron beam characterized by $\gamma \gg 1$, Eq. (6) is considerably simplified by defining $\Sigma(\theta)$ as:

$$\Sigma(\theta) = \frac{eE_0 \omega z^2}{2\gamma^2(\theta)\gamma_b mc^3}. \quad (7)$$

and utilizing Eq. (5), to obtain:

$$\frac{d\phi}{d\theta} = 1 - \Sigma \cos\theta. \quad (8)$$

In Eq. (8), the relativistic mass ratio $\gamma(\theta)$ has been shown in Eq. (4).

The beam current at the entrance 32 of the chamber in housing 24 is a constant value $I_b$. When a beam segment enters the chamber entrance, $z=O$ at $t=t_0$. As the beam segment arrives at some location in the chamber, it is stretched by a factor of $dt/dt_0$ and is proportional to the factor of $d\theta/d\phi$. The ratio of the input current at $z=O$ to the output current at distance z from the entrance is therefore expressed as $$\frac{I(\theta)}{I_b(\theta)} = \alpha \frac{N(z)}{|d\phi/d\theta|}. \quad (9)$$

where the normalization factor N is defined by:

$$\frac{2\pi}{N(z)} = \int_0^{2\pi} |d\theta/d\phi| d\theta. \quad (10)$$

and by $d\phi/d\theta$ obtained from Eqs. (6), (4) and (5) for a specified value of $\theta$. In Eq. (9), the parameter $\alpha$ represents loss factor of the beam during propagation, which is in the range satisfying $0 < \alpha < 1$. Eq. (9) is also based on certain assumptions including negligibly small beam head erosion, non-crossing beam segments and a sinusoidal wave for the beam segment in order to provide a basic understanding of beam current profile at a propagation distance z.

Substituting Eq. (7) into Eq. (8), the following equation is derived:

$$\frac{d\phi}{d\theta} = 1 - \frac{eE_0 \omega z^2}{2\gamma_b mc^3} f(\theta). \quad (11)$$

where the function $f(\theta)$ is defined by:

$$f(\theta) = \frac{\cos\theta}{\gamma^2} \quad (12)$$

based on the assumption that a relativistic beam satisfies $\gamma \gg 1$. From Eq. (12) the minimum value $f_{min}$ of the function $f(\theta)$ occurs when $\theta = \theta_0$, satisfying the equation:

$$\sin\theta_0 = \sqrt{\left(\frac{\gamma_b mc^2}{2eE_0 z}\right)^2 + 2} - \frac{\gamma_b mc^2}{2eE_0 z}. \quad (13)$$

which is a function of the propagation distance z.

One of the solutions to Eq. (13), which is in the range of $\theta_0$ satisfying $\pi/2 < \theta_0 < \pi$, ensures a negative sign for the minimum value $f_{min}$. Based therefore on Eqs. (9), (11) and (12), the maximum output current occurs at $\theta = \theta_0$ satisfying Eq. (13) and $\pi/2 < \theta_0 < \pi$. If the value of $eE_0 \omega z^2 f_{min}/2\gamma_b mc^2$ is less than $-1$, the output current has two peaks in the range of $\theta$ satisfying $\pi/2 < \theta < 3\pi/2$, indicating that the beam breaks up into two beamlets for each period of the wakefield waves. It is also noted from Eq. (13) that the parameter $\theta$ decreases from $\theta_0 = \pi/2$ as value of the parameter $eE_0 z/\gamma_b mc^2$ increases from zero to unity. However, the value of the parameter $eE_0 z/\gamma_b mc^2$ must be less than unity because $\gamma > 1$ [see Eq. (4)] and to preserve equilibrium conditions.

A comparison has been made between the foregoing theoretical model evaluation and a particle simulation study, wherein the plasma density $n_p = 4 \times 10^9$ electrons cm$^{-3}$, corresponds to the wakefield frequency $\omega = 2.86 \times 10^9$ rad/sec. The beam energy is 4.5 MeV corresponding to $\gamma_b = 10$. The beam current and rise time are 2 kA and 1 ns, respectively. The 24 fractional charge neutralization of the ion channel is $f_c = 0.5$. Based on such system parameter values, the maximum axial electric field is $E_0 = 10$ kV/cm as calculated from Eq. (2) for a chamber length of 4 m. Substituting necessary values into Eq. (13), the maximum output current is determined to be at $\theta_0 = 2n\pi + 1.973$, where $n = 0, 1, 2, \ldots$, and where the corresponding value of the parameter $eE_0\omega z^2 f_{min}/2\gamma_b mc^2$ is: $-0.84$, which is still larger than $-1$, ensuring a single peak for the output current during each oscillation period.

Assuming that the beam current of the input electron beam at 20 in FIG. 1 rises linearly in time t until $t = t_r$ and then remains constant at the plateau value, the beam and ion channel exhibits a net negative charge after the time $f_c t_r$, where $f_c$ is the charge neutralization factor of the ion channel. Therefore, there is a delay from the beam front in setting up the wakefield waves on the beam. In this context, the parameter $\theta = \omega(t_0 - f_c t_r)$.

Figure 2:
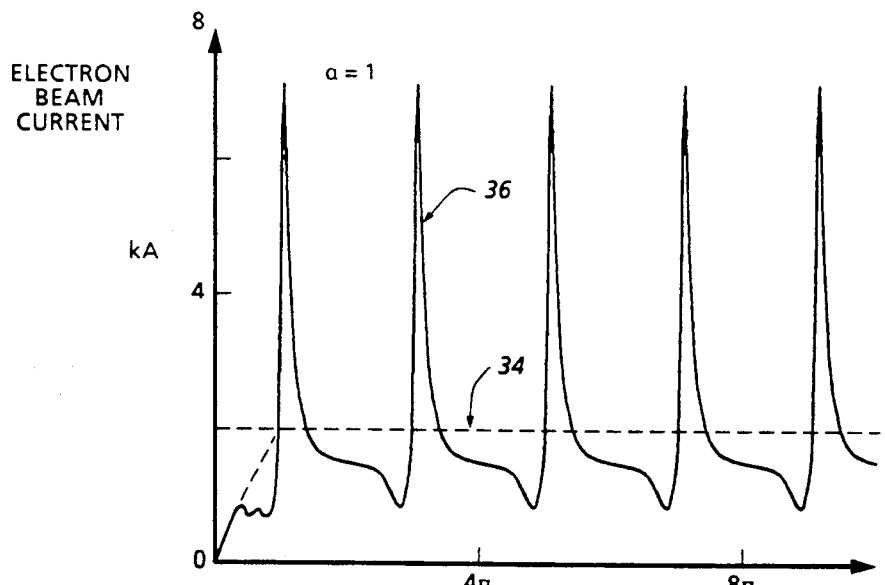

Shown in FIG. 2 are profile plots 34 and 36 of the input and output currents versus $\omega t_0$. The output current profile 36 is obtained from Eqs. (4), (9), (11) and (12) for $\alpha = 1$, corresponding to the case of no beam electron loss. The normalization factor N is calculated to be N = 0.756. A comparison of FIG. 2 with simulation results reveals remarkable agreement. For long-range propagation (i.e., z = 8 m) in theorectical studies, the output current profile numerically obtained from Eqs. (9) (4), (5) and (6), exhibits two peaks during each oscillation period.

When the relativistic mass factor $\gamma$ in Eq. (12) is much larger than unity, within the limits so established the ratio of the input current to the output current is simplified to:

$$\frac{I(t_0)}{I_b(t_0)} = \frac{\alpha\sqrt{1-\xi^2}}{1-\xi\cos\theta} \quad (14)$$

where the parameter $\xi$ as defined in Eq. (14) is approximated as:

$$\xi = \frac{\omega z}{2\gamma_b^3} \frac{eE_0 z}{mc^3} \quad (15)$$

The output beam current $I(t_0)$ in Eq. (14) has sharp peaks at $\theta = (2n+1)\pi$, where the value of $\cos\theta$ is the negative unity. Because of the functional form of the combination $1 + \Sigma \cos\theta$, the output beam current at z has a cusped form near the parameter $\theta = (2n+1)\pi$, which is distinctively different from a sinusoidal wave form. Defining the critical propagation distance $z_c$, as:

$$z_c = \sqrt{\frac{2\gamma_b^3 mc^3}{eE_0\omega}} \quad (16)$$

It is obvious from Eqs. (14) and (15) that the modulated beam current has one peak for each period until the beam segment $t_0$ reaches $z = z_c$. If the beam is propagated beyond $z = z_c$, it starts to bunch into two peaks per each period, thereby further breaking the beam into small beamlets. Symptoms of this behavior have been observed in a particle simulation study of long-range beam propagation. Accordingly, the axial distance between entrance 32 to the channel chamber and entrance 38 to the cavity 40 in the Klystron device 18 is such as to accommodate bunching of the current modulated electron beam 30.

FIG. 2 graphically demonstrates that current modulation of the intense electron beam 20 is efficiently achieved by the wakefield effects of the tenuous background plasma 26 in the channel component 16. The large amplitude modulation of the electron current is fully non-linear. Such highly modulated electron beam 30 passes through the entrance opening 38 in the catcher cavity 40 of the Klystron device 18 in axial alignment with the channel component 16 as shown in FIG. 1. The kinetic energy of the beam electrons are thereby converted into microwave energy very close in frequency to the electron plasma frequency ($\omega_{pe}$) of the background plasma 26.

Except for the elimination of an external high-power microwave source to drive the cavity 40 and the electromagnetic field induced therein for beam current modulation, operation of the Klystron device 18 is generally well known. In the example illustrated in FIG. 1, the Klystron device includes a drift tube section 42, the internal end of which is at the aforementioned entrance 38 of the cavity 40 formed between end walls 42 and 44. The cavity 40 is thereby sealingly enclosed within a ceramic cylinder 46 from which microwave energy, as denoted by reference numeral 48, is radiated. Since current modulation and bunching of the electron beam propagated through the drift tube section 42 into the cavity 40 is effected by wakefield effects produced within the channel component 16 as hereinbefore described, the space-charge current limiting threshold problems heretofore associated with a high power microwave device of the Klystron amplifier type are avoided.

Numerous other modifications and variations of the present invention are possible in light of the foregoing teachings. It is therefore to be understood that within the scope of the appended claims the invention may be practiced otherwise than as specifically described.

We claim:

1. In combination with a Klystron device having a cavity within which microwave energy is generated in response to propagation of a relativistic high-current electron beam, a continuous source of electrons, channel means to which said electron beam is continuously supplied from the source for propagation into the cavity of the Klystron device and means establishing a preionized background plasma within said channel means for current modulation of the electron beam and bunching thereof prior to entry into the cavity of the Klystron device.

2. The combination of claim 1 wherein kinetic energy of the electrons in the electron beam is converted into the microwave energy within the cavity substantially equal in frequency to that of the background plasma.

3. In a microwave generator having a cavity within which kinetic energy of electrons from a source is converted into microwave energy at a predetermined frequency, accelerator means connected to said source for continuous supply of an intense beam of the electrons, channel means connected to said accelerator means for directing said beam of the electrons to the cavity and ion focussing means for current modulation of the said beam of the electrons during propagation through the channel means as a result of wake field effects.

4. The combination of claim 3 including a drift tube extending from the channel means into the cavity through which bunching of the beam occurs because of the wake field effects.

5. The combination of claim 4 wherein said wake field effects include electrostatic establishment of an electric field within the channel means having axial and radial components.

6. The combination of claim 5 wherein said axial component of the electric field produces said current modulation of the electron beam while the radial component produces oscillation of plasma electrons approximately at said predetermined frequency of the microwave energy.

7. The combination of claim 3 wherein said wake field effects include electrostatic establishment of an electric field within the channel means having axial and radial components.

8. The combination of claim 7 wherein said axial component of the electric field produces said current modulation of the electron beam while the radial component produces oscillation of plasma electrons approximately at said predetermined frequency of the microwave energy.

* * * * *